(12) United States Patent
Chuang et al.

(10) Patent No.: US 9,406,669 B2
(45) Date of Patent: Aug. 2, 2016

(54) METHOD AND STRUCTURE FOR VERTICAL TUNNELING FIELD EFFECT TRANSISTOR AND PLANAR DEVICES

(71) Applicant: Taiwan Semiconductor Manufacturing Company, Ltd., Hsin-Chu (TW)

(72) Inventors: Harry-Hak-Lay Chuang, Singapore (SG); Yi-Ren Chen, Taoyuan County (TW); Chi-Wen Liu, Hsin-Chu (TW); Chao-Hsiung Wang, Hsin-Chu (TW); Ming Zhu, Singapore (SG)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/794,481

(22) Filed: Mar. 11, 2013

(65) Prior Publication Data
US 2014/0252442 A1 Sep. 11, 2014

(51) Int. Cl.
| | |
|---|---|
| *H01L 21/336* | (2006.01) |
| *H01L 27/06* | (2006.01) |
| *H01L 21/8234* | (2006.01) |
| *H01L 21/8238* | (2006.01) |
| *H01L 27/088* | (2006.01) |
| *H01L 27/092* | (2006.01) |

(52) U.S. Cl.
CPC ...... *H01L 27/0629* (2013.01); *H01L 21/82385* (2013.01); *H01L 21/823456* (2013.01); *H01L 21/823487* (2013.01); *H01L 21/823885* (2013.01); *H01L 27/088* (2013.01); *H01L 27/0922* (2013.01)

(58) Field of Classification Search
CPC ............ H01L 21/823814; H01L 29/6666; H01L 29/7827; H01L 21/823487; H01L 21/823885; H01L 27/0617
USPC ......... 257/135, 220, 263, 328, 329, 170, 466, 257/496, 586, 618, 624; 438/268, 275, 286
See application file for complete search history.

(56) References Cited

U.S. PATENT DOCUMENTS

| 8,754,470 | B1 * | 6/2014 | Chuang et al. ............... 257/329 |
| 2010/0200913 | A1 * | 8/2010 | Masuoka et al. ............... 257/329 |

(Continued)

OTHER PUBLICATIONS

Gandhi, Ramanathan et al., "Vertical Si-Nanowire *n*-Type Tunneling FETs With low Subthreshold Swing (≤50 mV/decade) at Room Temperature", IEEE Electron Device Letters, Apr. 2011, pp. 437-439, vol. 32, No. 4.

*Primary Examiner* — Marcos D Pizarro
(74) *Attorney, Agent, or Firm* — Haynes and Boone, LLP

(57) ABSTRACT

The present disclosure provides one embodiment of a method of forming a tunnel field effect transistor (TFET). The method includes forming a semiconductor mesa on a semiconductor substrate; performing a first implantation to the semiconductor substrate and the semiconductor mesa to form a drain of a first type conductivity; forming a first dielectric layer on the semiconductor substrate and sidewall of the semiconductor mesa; forming a gate stack on the sidewall of the semiconductor mesa and the first dielectric layer; forming a second dielectric layer on the first dielectric layer and the gate stack; and forming, on the semiconductor mesa, a source having a second type conductivity opposite to the first type conductivity. The gate stack includes a gate dielectric and a gate electrode on the gate dielectric. The source, drain and gate stack are configured to form the TFET.

20 Claims, 17 Drawing Sheets

(56) References Cited

U.S. PATENT DOCUMENTS

| | | |
|---|---|---|
| 2011/0253981 A1 | 10/2011 | Rooyackers et al. |
| 2012/0248529 A1 | 10/2012 | Liu et al. |
| 2012/0319201 A1 | 12/2012 | Sun et al. |
| 2014/0061775 A1 | 3/2014 | Chuang et al. |
| 2014/0203352 A1 | 7/2014 | Chuang et al. |

\* cited by examiner

US 9,406,669 B2

METHOD AND STRUCTURE FOR VERTICAL TUNNELING FIELD EFFECT TRANSISTOR AND PLANAR DEVICES

BACKGROUND

The scaling of conventional complementary metal-oxide-semiconductor field effect transistor (CMOSFET) faces challenges of rapid increase in power consumption. Tunnel field effect transistor (TFET) is a promising candidate enabling further scaling of power supply voltage without increase of off-state leakage current due to its sub-60 mV/dec subthreshold swing. However, input/output (I/O) devices normally have thicker gate dielectric and larger device dimensions. The I/O TFET devices are difficult to be fabricated when integrated with TFET devices.

Accordingly, there is a need for a structure having TFET device and planar I/O devices integrated together and a method making the same to address these concerns.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
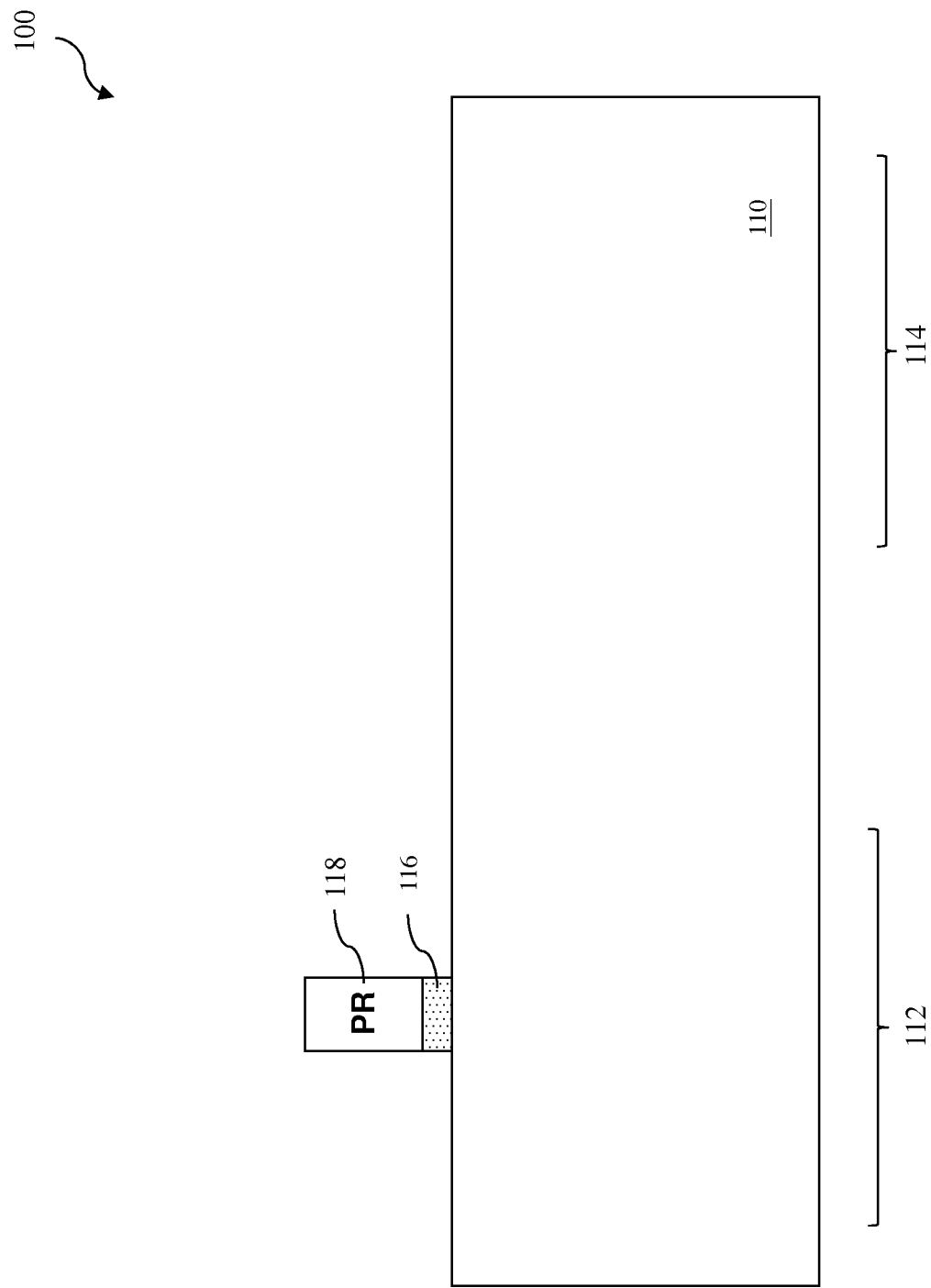
FIGS. 1-13 are sectional views of a semiconductor structure having a tunnel field effect transistor (TFET) structure at various fabrication stages constructed according to one or more embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIGS. 1-13 are sectional views of a semiconductor structure 100 at various fabrication stages constructed according to one or more embodiment. The semiconductor structure 100 includes one or more tunnel field effect transistor (TFET). In furtherance of the embodiment, the TFET has a vertical structure wherein the channel is vertically configured. The source and drain are vertically disposed with the channel interposed therebetween. FIG. 14 is a flowchart of a method 200 to form the semiconductor structure 100 constructed according to one or more embodiment. The semiconductor structure 100 and the method 200 making the same are collectively described with reference to FIGS. 1-14.

Referring to FIG. 1, the semiconductor structure 100 includes a semiconductor substrate 110 of a first semiconductor material. In the present embodiment, the first semiconductor material is silicon. Alternatively, the first semiconductor material may include other proper semiconductor material. In one embodiment, the semiconductor substrate 110 includes a buried dielectric material layer for isolation formed by a proper technology, such as a technology referred to as separation by implanted oxygen (SIMOX). In some embodiments, the substrate 110 may be a semiconductor on insulator, such as silicon on insulator (SOI).

The semiconductor substrate 110 includes a first region 112 for a tunnel field effect transistor (TFET) and a second region 114 for a field effect transistor (FET), such as a metal-oxide-semiconductor FET (MOSFET). In one embodiment, the TFET is a core device and the MOSFET is an input/output (I/O) device. Particularly, the TFET device is a vertical TFET where the channel of the TFET is along a direction perpendicular to the top surface of the semiconductor substrate 110. The source and drain of the vertical TFET are configured to be interposed by the channel in the vertical direction.

Referring to FIGS. 1 and 14, the method 200 begins at operation 202 by forming a patterned hard mask 116 to define an area for a semiconductor mesa on the semiconductor substrate 110 within the first region 112. The patterned hard mask 116 includes a dielectric material with etch selectivity to the semiconductor substrate 110. In the present embodiment, the patterned hard mask 116 includes silicon nitride (SiN). In other embodiments, the patterned hard mask 116 alternatively includes other suitable material, such as silicon oxynitride or silicon carbide.

In one embodiment, the patterned hard mask 116 is formed by a procedure including deposition, lithography process and etching. In furtherance of the embodiment, the formation of the patterned hard mask 116 includes depositing a hard mask layer by a suitable technique, such as chemical vapor deposition (CVD); forming a patterned photoresist layer 118 on the hard mask layer using a lithography process; etching the hard mask layer to form the patterned hard mask 116 using the patterned photoresist layer 118 as an etch mask; and thereafter removing the patterned photoresist layer 118 by a suitable technique, such as wet stripping or plasma ashing. In one embodiment, the lithography process includes forming a photoresist layer by spin-on coating; exposing the photoresist layer using an exposure energy, such as ultraviolet (UV) light, and developing the exposed photoresist layer to form the patterned photoresist layer using a developing chemical. In another example, the lithography process includes spin-on coating, soft baking, exposing, post-exposure baking, developing and hard baking. In other embodiment, the lithography process to form the patterned photoresist layer 118 may alternatively use other technique, such as e-beam lithography, maskless patterning or molecular print.

Figure 2:
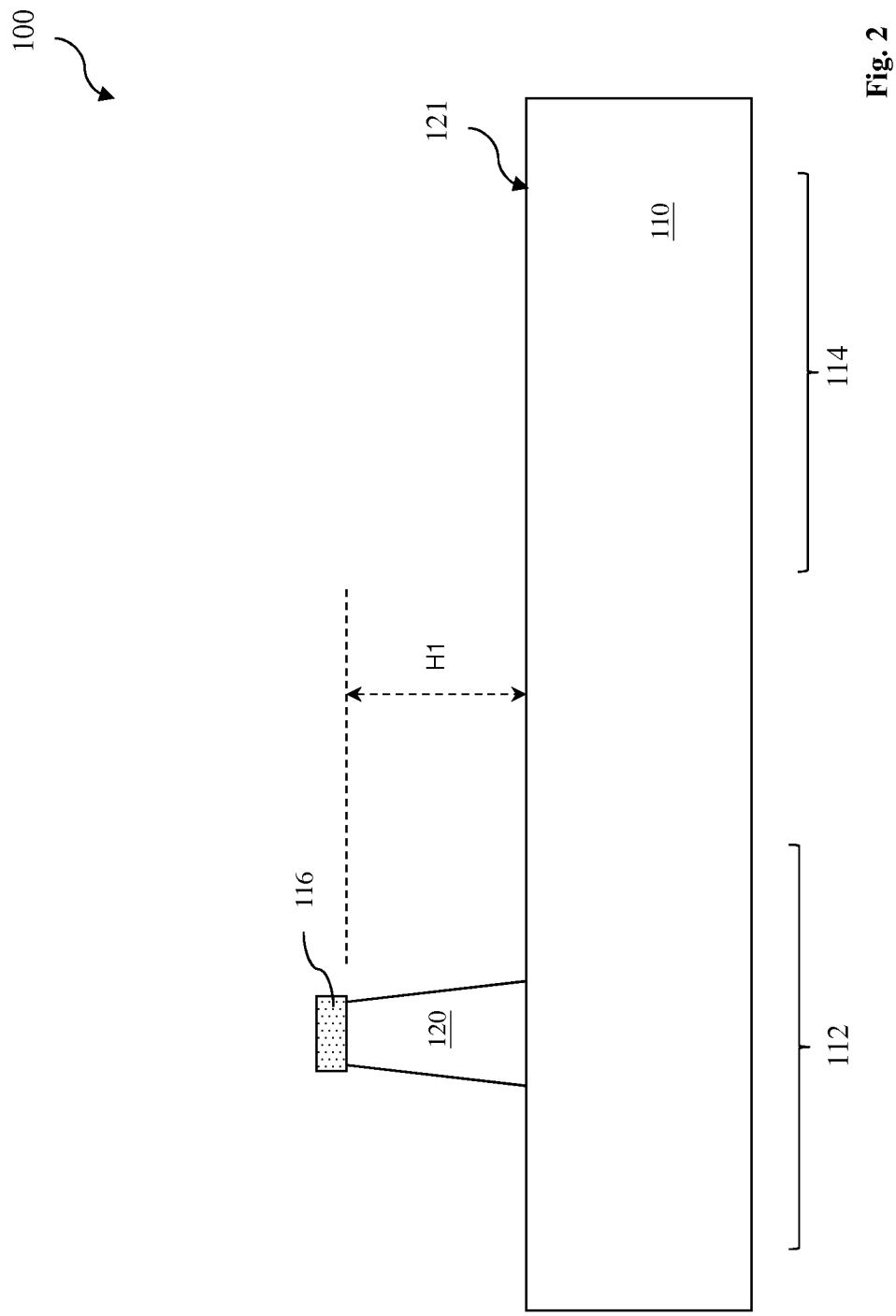

Referring to FIGS. 2 and 14, the method 200 includes an operation 204 by selectively recessing the semiconductor substrate to form a semiconductor mesa 120. In the present embodiment, an etch process is applied to selectively etch the semiconductor substrate 110 using the patterned hard mask 116 as an etch mask. For example, the etch process includes a dry etch to etch silicon of the semiconductor substrate 110. In one embodiment, the etch process is tuned to form the semiconductor mesa 120 having a sidewall profile in a trapezoidal shape. Particularly, the sidewall profile of the semiconductor mesa has a tilting angle less than 90° and greater than 45°, where the tilting angle is measured relative to the top surface 121 of the semiconductor substrate 110. Thus formed the semiconductor mesa 120 has a better fabrication benefits during the subsequent process steps, such as deposition and/ or etch.

The semiconductor mesa 120 has a height "H1" as a vertical dimension relative to the top surface 121 of the semiconductor substrate 110. In one example, the recess depth ranges between about 50 nm and about 200 nm. Therefore, the height H1 of the semiconductor mesa 120 is in the same range for this example.

Figure 3:
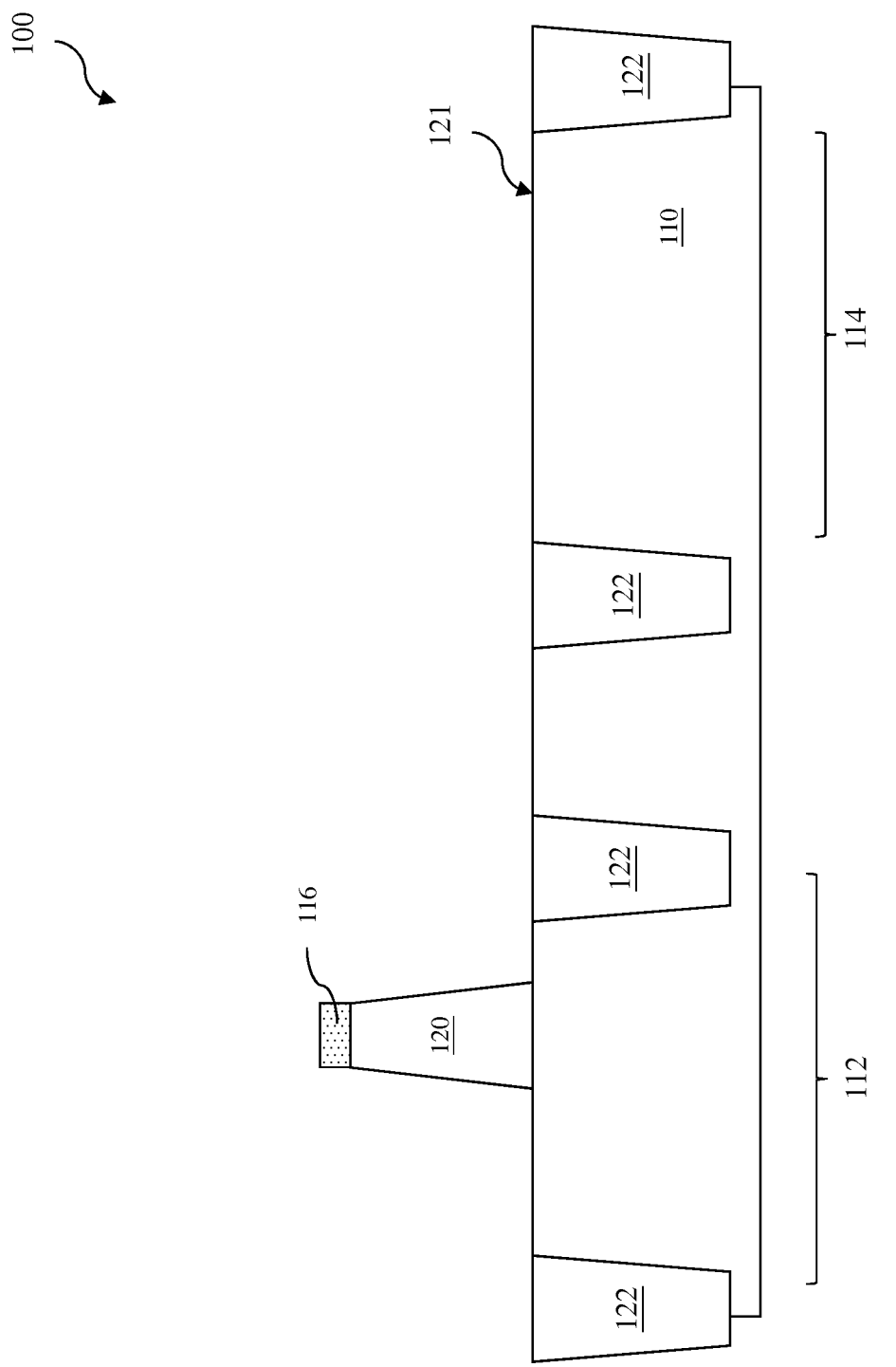

Referring to FIGS. 3 and 14, the method 200 includes an operation 206 by forming a plurality of isolation features 122 in the semiconductor substrate 110. In the present embodiment, the isolation features 122 are shallow trench isolation (STI) features 122. The STI features 122 are formed in the semiconductor substrate 110 and define various semiconductor regions, such as 112 and 114. The semiconductor regions 112 and 114 are separated and isolated from each other by the STI features 122. Furthermore, the top surface 121 of the semiconductor substrate 110 and top surfaces of the STI features 112 are coplanar at the present fabrication stage.

As the semiconductor mesa 120 is present, the formation of the STI features 122 is designed without damaging to the semiconductor mesa 120.

In one embodiment, the formation of the STI features 122 includes: forming a hard mask with openings that define the regions for STI features; etching the semiconductor substrate 110 through the openings of the hard mask to form trenches; depositing dielectric material to fill in the trenches; performing a chemical mechanical polishing (CMP) process to remove excessive dielectric material above the semiconductor mesa 120; and then selectively etching back the dielectric material to the top surface of the semiconductor substrate 110, resulting in the STI features 122. In the CMP process, the patterned hard mask 116 may serve as a polishing stop layer such that the CMP process properly stops on the patterned hard mask 116. In the etch-back process, the patterned hard mask 116 may serve as an etch mask to further protect the semiconductor mesa 120 from loss.

In another embodiment, the STI features 122 are formed before the formation of the semiconductor mesa 120. In this embodiment, the formation of the STI features 122 includes: forming a hard mask with openings that define the regions for STI features; etching the semiconductor substrate 110 through the openings of the hard mask to form deep trenches; depositing dielectric material to fill in the trenches; and performing a CMP process to remove excessive dielectric material above the semiconductor substrate 110, resulting in deep trench isolation features. Thereafter, the operations 202 and 204 are performed to form the patterned hard mask 116 and to form the semiconductor mesa 120, respectively. However, in the operation 204 to recess the semiconductor substrate 110 by an etch process, the etch process is designed to recess both the semiconductor material (silicon in the present embodiment) of the semiconductor substrate 110 and the dielectric material of the deep trench isolation features. Thus, the upper portions of the deep trench isolation features are removed, resulting in shallow trench isolation features 122. The height difference between the deep trench isolation features and the STI features 122 is about the height H1 of the semiconductor mesa 120.

In another embodiment, the deposition of the dielectric material includes thermal oxidation of the trenches and then filling in the trenches by the dielectric material, such as silicon oxide, by CVD. In one example, the CVD process to fill in the trenches includes high density plasma CVD (HD-PCVD).

Other features may be formed on the semiconductor substrate 110. In one example, various doped regions, such as n-well and p-wells, are formed in the semiconductor substrate 110 (such a well in the second region 114) by one or more implantation or other suitable doping technology.

Figure 4:
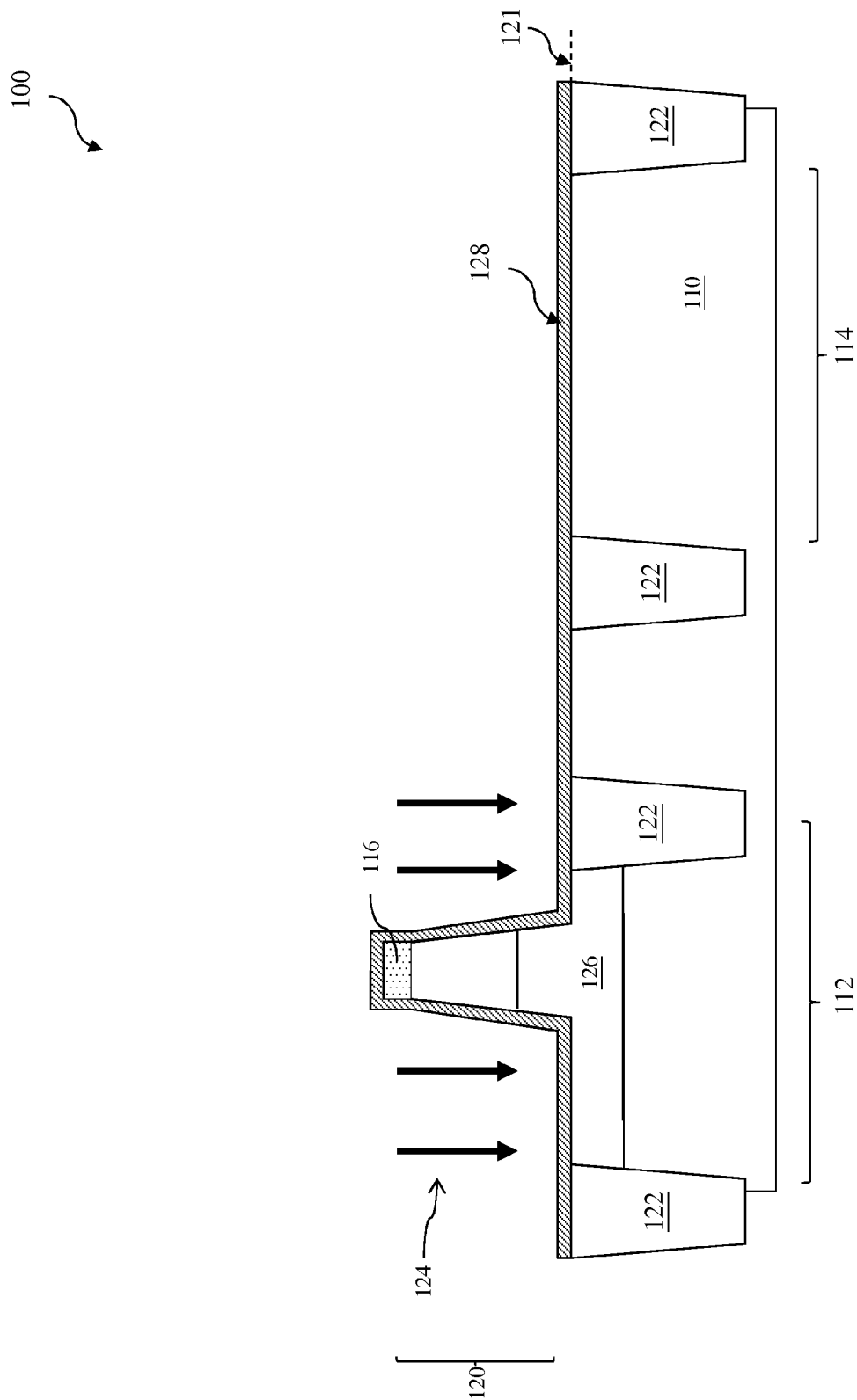

Referring to FIGS. 4 and 14, the method 200 includes an operation 208 to form one of source and drain of the TFET by a first ion implantation process 124. In the present embodiment, a drain 126 of the TFET is formed by the first ion implantation 124. The drain 126 is formed in the bottom portion of the semiconductor mesa 120 and further extended to the semiconductor substrate 110 below the top surface 121. The drain 126 includes a n-type dopant (such as phosphorous) when the TFET is n-type or a p-type dopant (such as boron) when the TFET is p-type.

In one embodiment, the operation 208 includes depositing a screening layer 128 on the semiconductor substrate 110 and the semiconductor mesa 120; and performing a selective implantation to the semiconductor substrate 110 within the first region 112 and the semiconductor mesa 120. The screening layer 128 is used for implantation screening and elimination of the channeling effect during the implantation.

Particularly, the selective implantation includes forming a patterned photoresist layer on the semiconductor substrate 110, performing the ion implantation process using the patterned photoresist layer as an implantation mask, and removing the patterned photoresist layer thereafter by wet stripping or plasma ashing. The patterned photoresist layer is formed by a lithography process as described above. The patterned photoresist layer covers the semiconductor substrate 110 within the second region 114 and has an opening in the first region 112 such that the semiconductor substrate within the first region 112 is uncovered for receiving the ion implantation.

The drain 126 formed by the ion implantation 124 is further annealed for activation by an annealing process. The annealing process is implemented right after the ion implantation 124 in the operation 208 or is alternatively implemented after the formation of other doped features for collective activation. In one embodiment, the annealing process includes rapid thermal annealing (RTA). In other embodiments, the annealing process alternatively includes laser annealing, spike annealing, million second anneal (MSA) or other suitable annealing technique.

Figure 5:
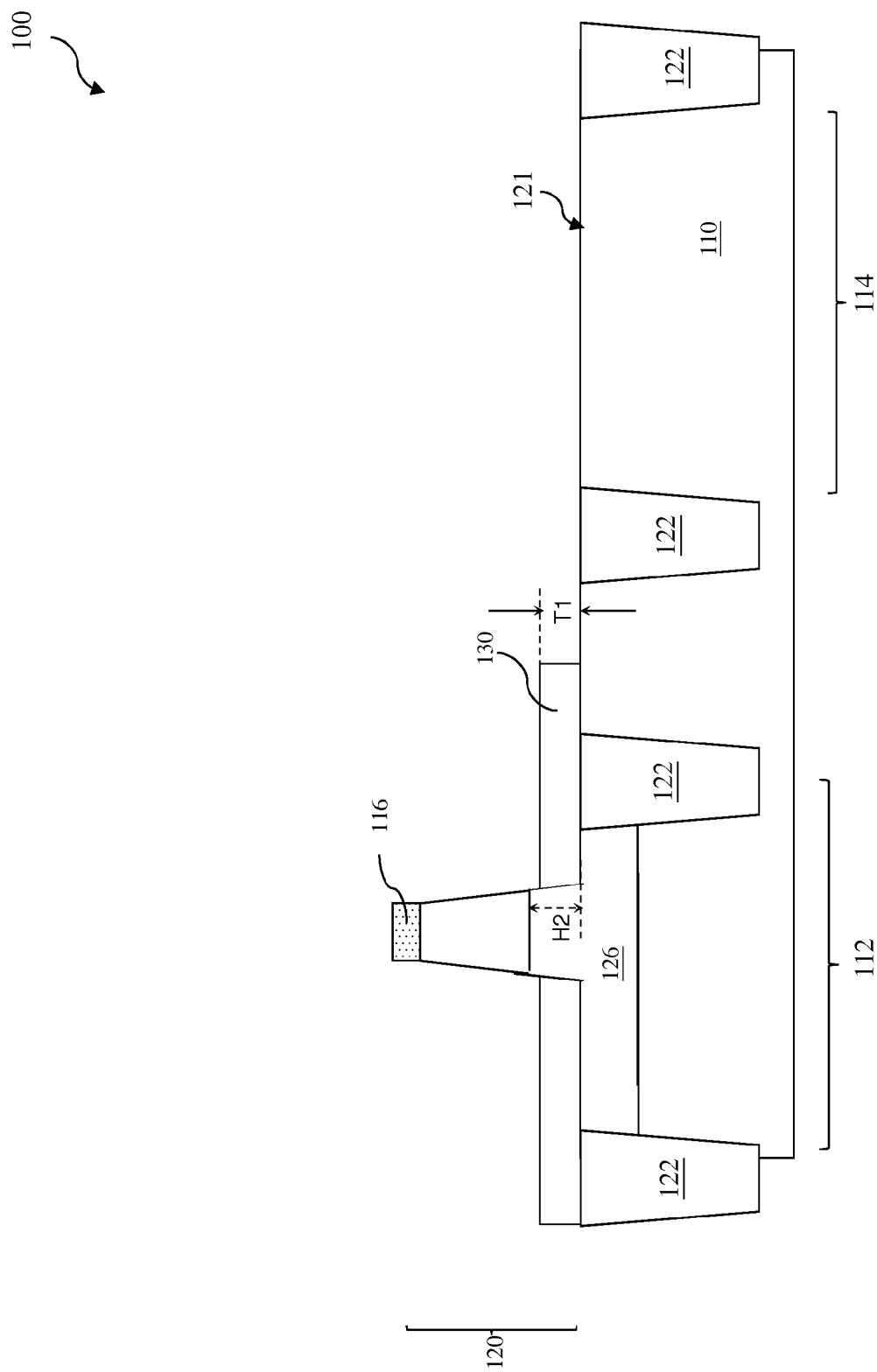

Referring to FIGS. 5 and 14, the method 200 includes an operation 210 to form a TFET isolation feature 130. The TFET isolation feature 130 provides isolation function to and properly configures various features of the TFET. For examples, the gate is properly aligned with the channel, not directly formed on the semiconductor substrate 110, and is substantially off from the drain.

The TFET isolation feature 130 includes a dielectric material, such as silicon oxide in the present example. The TFET isolation feature 130 may alternatively include other suitable dielectric material. The TFET isolation feature 130 is disposed on the semiconductor substrate 110 within the first region 112. Particularly, the thickness T1 of the TFET isolation feature 130 is chosen such that the subsequent formed gate can be properly configured with the channel and the drain. As illustrated in FIG. 5, "H2" is the height of the drain 126 measured from the top surface of the semiconductor substrate 110 up to the top surface of the drain. The thickness T1 of the TFET isolation feature 130 is chosen such that T1 is little less H1 as T1<H1, to has a small overlap between the gate and drain, and to further ensure that the gate completely couples with the channel.

In one embodiment, the operation 210 includes removing the screen layer 128 by an etch process (such as a wet etch); forming a dielectric material layer (such as silicon oxide in the present embodiment) on the semiconductor substrate 110; and selectively removing the dielectric material layer from the second region 114. In one embodiment, the forming of the dielectric material layer includes depositing a dielectric material, performing a CMP process to remove a portion of the dielectric material above the semiconductor mesa 120, and etch back the dielectric material. In another embedment, the selective removal of the dielectric material layer includes forming a patterned photoresist layer on the semiconductor substrate 110, performing an etch process to the dielectric material layer using the patterned photoresist layer as an etch mask, and removing the patterned photoresist layer thereafter by wet stripping or plasma ashing. The patterned photoresist layer is formed by a lithography process as described above. The patterned photoresist layer covers the semiconductor substrate 110 in the first region 112 and has an opening in the second region 114 such that the semiconductor substrate within the second region 114 is uncovered.

Figure 6:
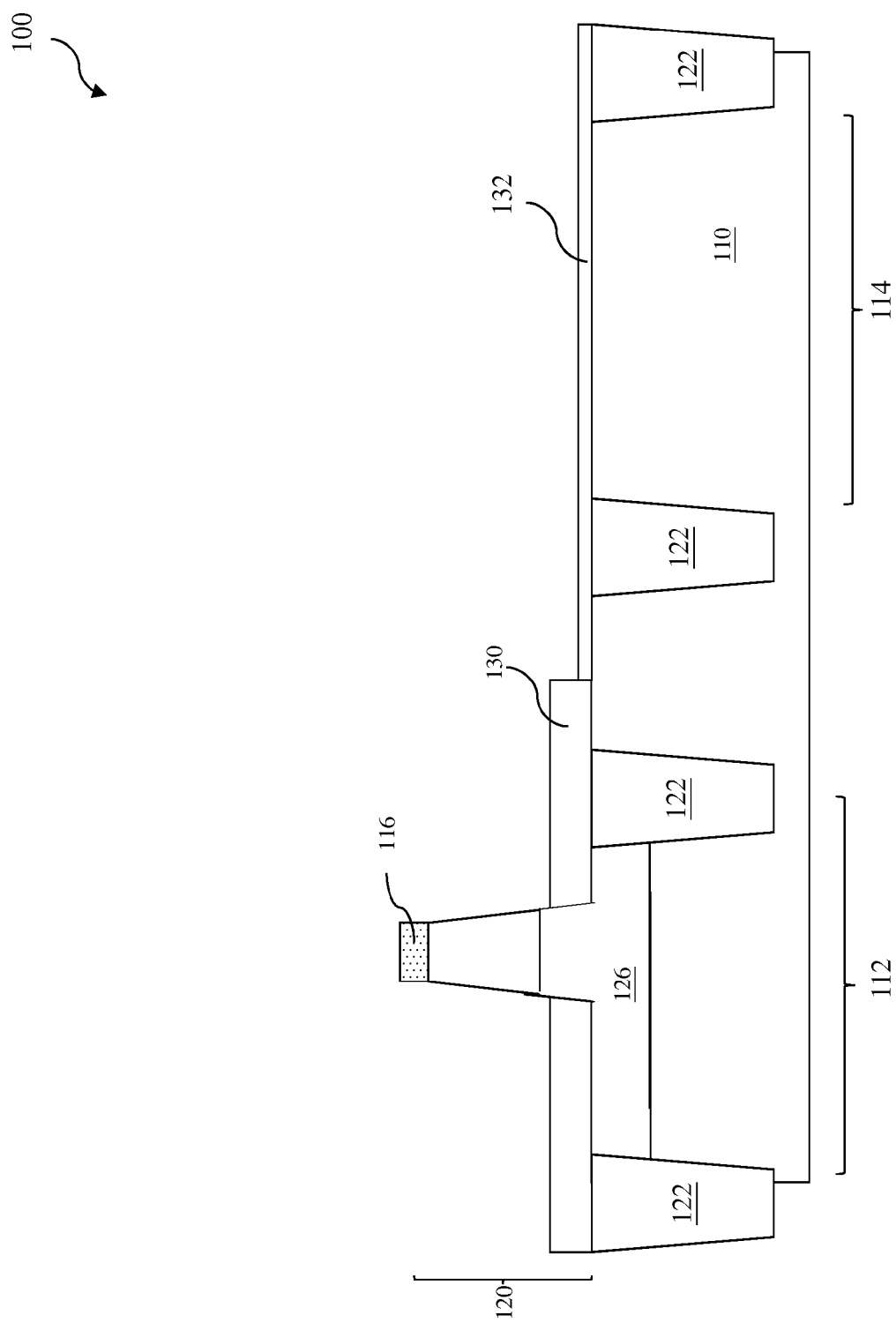

Referring to FIGS. 6 and 14, the method 200 may include an operation 212 to form a gate oxide layer 132 on the semiconductor substrate 110 within the second region 114. The gate oxide layer 132 may function as an interfacial layer for the I/O device in the second region 114 and/or tuning the overall gate dielectric layer for requirement of the I/O device.

The formation of the gate oxide layer 132 in the operation 212 may utilize a suitable technology, such as thermal oxidation, atomic layer deposition (ALD) or CVD. In one embodiment, the operation 212 further includes selectively removing the gate oxide layer 132 from the first region 112. In the present example, the selective removal of the gate oxide layer 132 includes forming a patterned photoresist layer on the semiconductor substrate 110, performing an etch process to the gate oxide layer 132 using the patterned photoresist layer as an etch mask, and removing the patterned photoresist layer thereafter by wet stripping or plasma ashing. The patterned photoresist layer covers the semiconductor substrate 110 in the second region 114 and has an opening in the first region 112 such that the semiconductor substrate within the first region 112 is uncovered.

Figure 7:
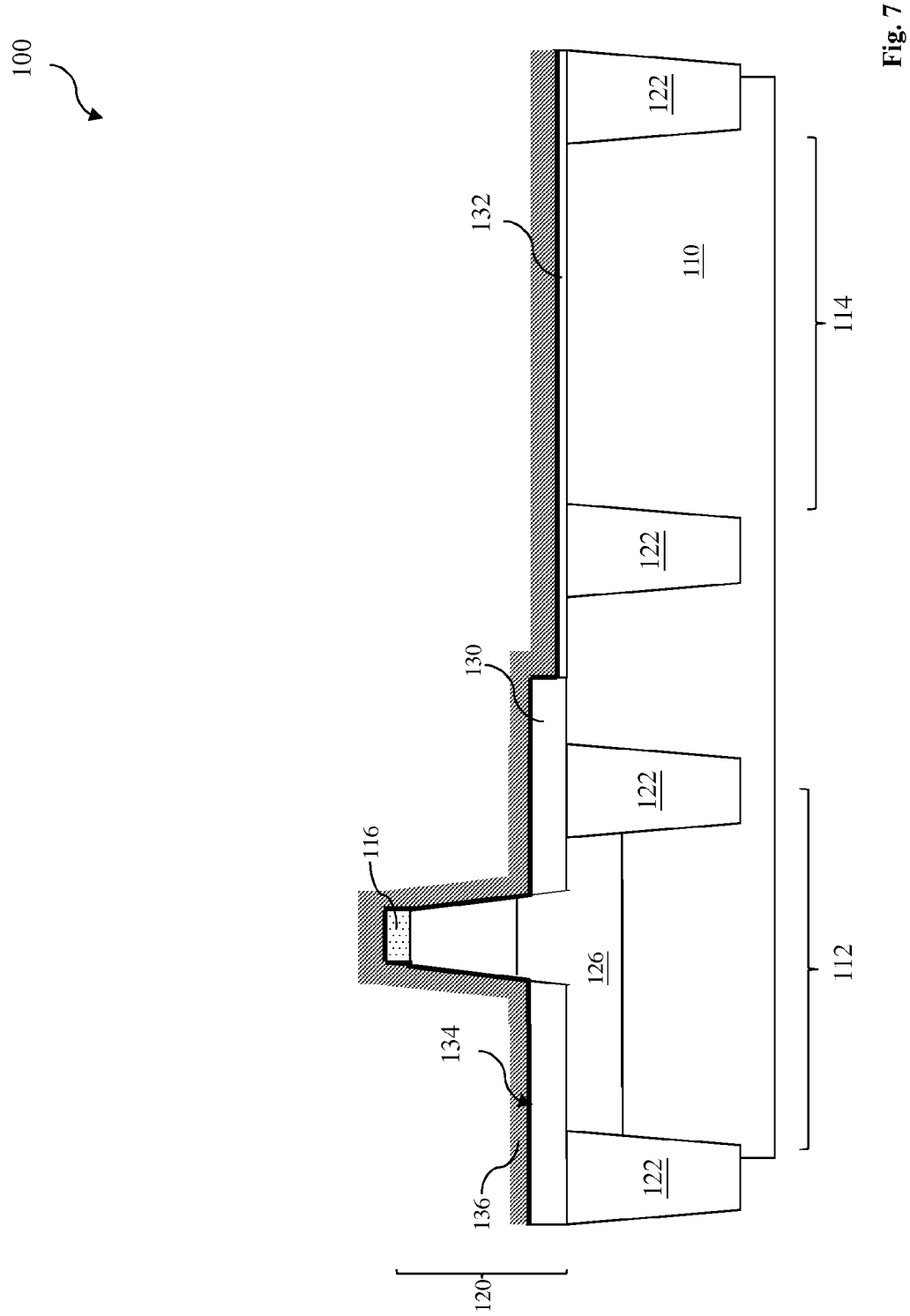

Referring to FIGS. 7 and 14, the method 200 includes an operation 214 to form gate material layers on the semiconductor substrate 110. The gate material layers are formed on the semiconductor substrate 110 and the semiconductor mesa 120. Especially, the gate material layers are formed on sidewalls of the semiconductor mesa 120 and on the top surface thereof as well. In the present case, the gate material layers are disposed on the patterned hard mask 116.

The gate material layers include gate a dielectric material layer 134 and a gate electrode layer 136. In the present embodiment, the gate material layers include high k dielectric material and metal, therefore, referred to as high k metal gate. In one embodiment, the gate dielectric material layer 134 includes an interfacial layer (such as silicon oxide) and a high k dielectric material layer. A high k dielectric material is a dielectric material having a dielectric constant greater than that of thermal silicon oxide. For example, a high k dielectric material includes hafnium oxide (HfO) or other suitable metal oxide. The gate electrode layer 136 includes a metal (or metal alloy) layer and may further include a polycrystalline silicon (polysilicon) layer on the metal layer.

The operation 214 includes depositing various gate materials on the semiconductor substrate, specifically on the TFET isolation feature 130 and the gate oxide layer 132 in the present embodiment. Especially as described in one embodiment where the semiconductor mesa 120 has a trapezoidal profile, it is beneficial for depositions of various gate materials. In one embodiment, the formation of the interfacial layer (silicon oxide in the present example) includes thermal oxidation, ALD, CVD or other suitable technology. In another embodiment, the formation of the high k dielectric material layer includes ALD, metalorganic CVD (MOCVD), physical vapor deposition (PVD), or other suitable technology. In yet another embodiment, the formation of the metal layer includes PVD, plating, or other suitable technology. In yet another embodiment, the formation of the polysilicon layer includes CVD or other suitable technology.

Figure 8:
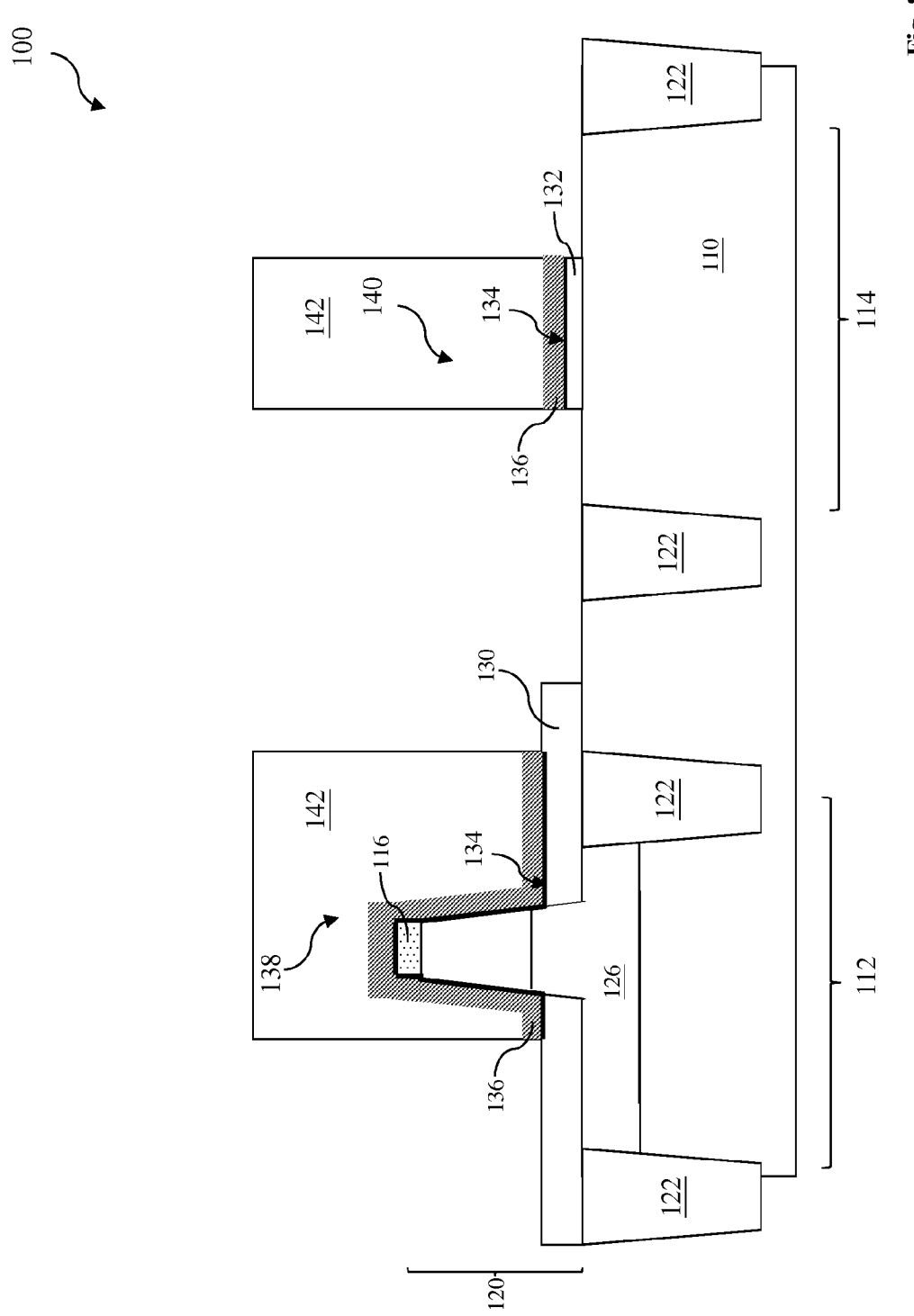

Referring to FIGS. 8 and 14, the method 200 includes an operation 216 to pattern the gate material layers including the gate dielectric material layer 134 and the gate electrode layer 136, resulting in a first material stack 138 in the first region 112 and a second material stack 140 in the second region 114. The first material stack 138 includes a first portion on the top of the semiconductor mesa 120, a second portion on the sidewall of the semiconductor mesa 120, and a third portion on the top of the TFET isolation feature 130. The third portion of the material stack 138 is horizontally extended on the TFET isolation feature 130.

Particularly, the patterning the gate material layers includes forming a patterned photoresist layer on the gate material layers, performing an etch process to the gate material layers using the patterned photoresist layer 142 as an etch mask, and removing the patterned photoresist layer thereafter by wet stripping or plasma ashing. In one example, the etch process includes more than one etch steps using different etchants to etch respective materials in the gate material layers. Each etchant is designed to effectively etch the respective material. The patterned photoresist layer 142 is formed by a lithography process. The patterned photoresist layer 142 covers the semiconductor substrate 110 in the areas for the first material stack 138 and the second material stack 140, as illustrated in FIG. 8. The first material stack 138 is disposed on the TFET oxide feature 130 and the second material stack 140 is disposed on the gate oxide layer 132. In the present embodiment, the gate oxide layer is also patterned as well by the operation 216. The patterned gate oxide layer 132, the gate dielectric layer 134 and the gate electrode layer 136 in the second region 114 constitute the gate stack for the I/O device.

Figure 9:
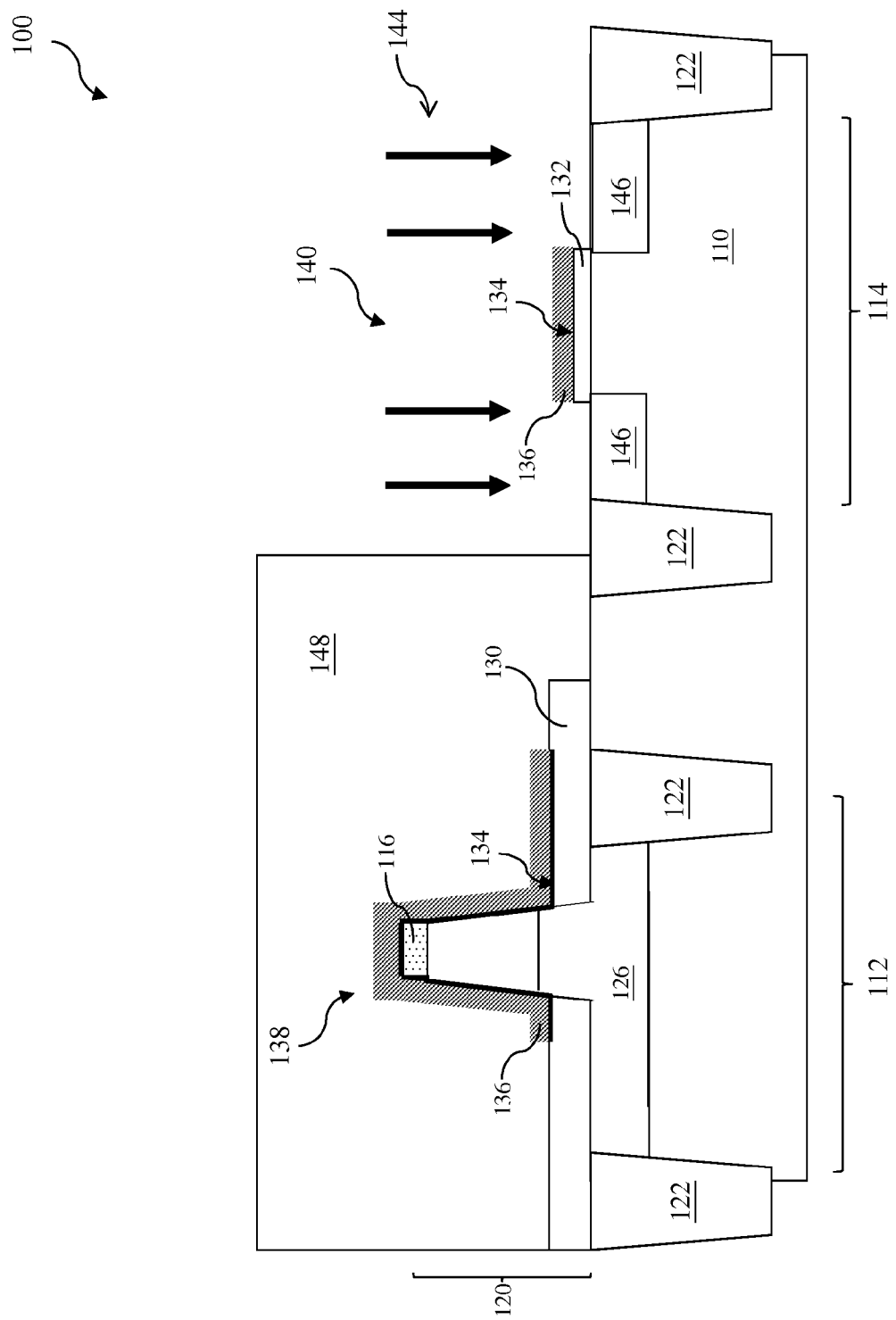

Referring to FIGS. 9 and 14, the method 200 includes an operation 218 to perform an ion implantation process 144 to form the source and drain features 146 of the I/O device in the second region 114. In the present embodiment, the I/O device is a MOSFET. The source and drain features 146 includes a n-type dopant (such as phosphorous) when the I/O device is is n-type MOSFET or a p-type dopant (such as boron) when the I/O device is p-type MOSFET.

The formation of the source and drain features 146 includes applying the ion implantation process 144 selectively to the semiconductor substrate 110 within the second region 114. The selective implantation includes forming a patterned photoresist layer 148 on the semiconductor substrate 110, performing an ion implantation process 144 using the patterned photoresist layer 148 as an implantation mask, and removing the patterned photoresist layer thereafter. The patterned photoresist layer 148 is formed by a lithography process. The patterned photoresist layer 148 covers the semiconductor substrate 110 in the first region 112 and has an opening in the second region 114 such that the semiconductor substrate 110 within the second region 114 is uncovered for receiving the respective ion implantation.

Figure 10:
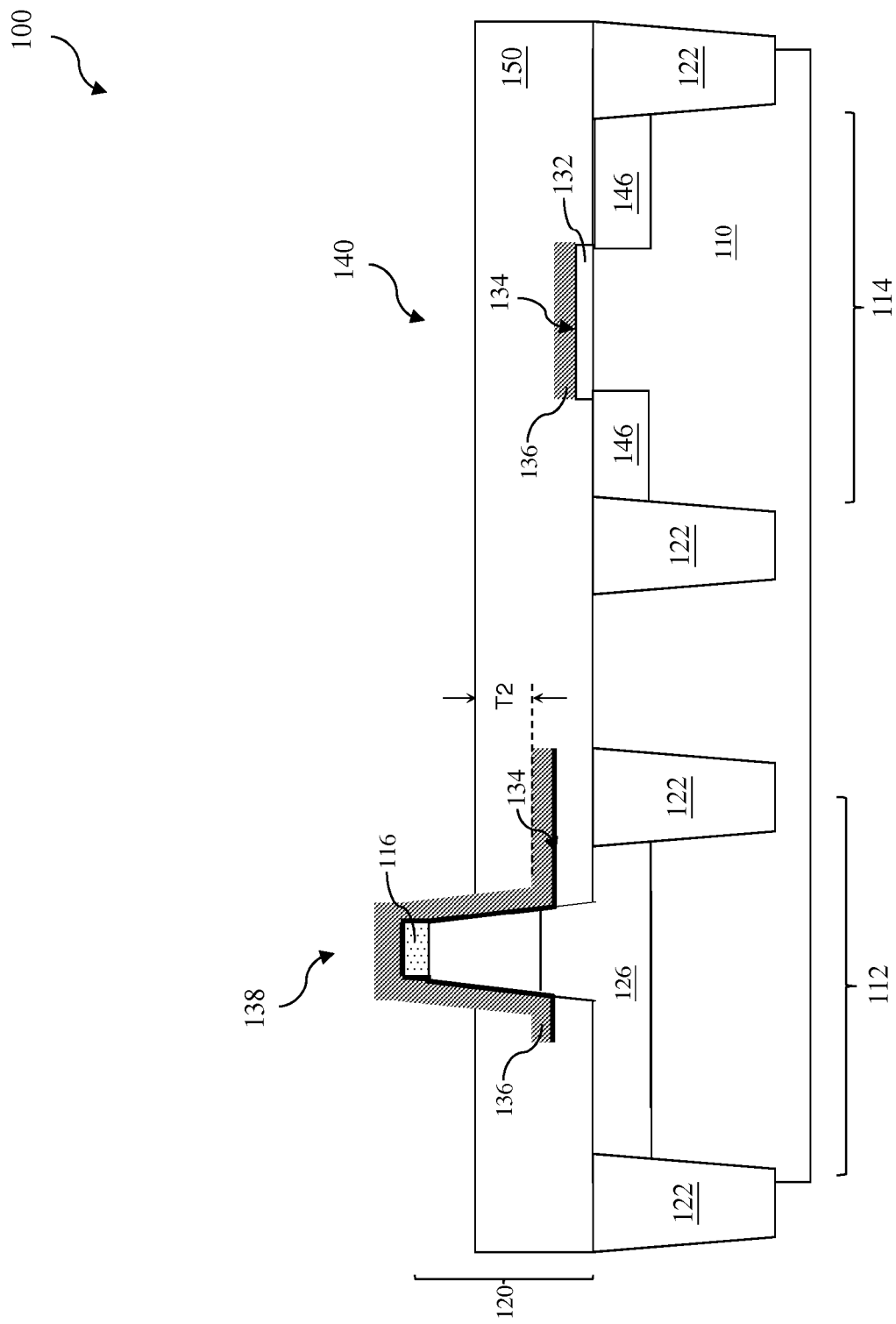

Referring to FIGS. 10 and 14, the method 200 includes an operation 220 to form a TFET isolation layer 150 on the semiconductor substrate 110. The TFET isolation layer 150 provides isolation function to and properly configures various features of the TFET. For examples, the source of the TFET is properly disposed thereby.

The TFET isolation layer 150 includes a dielectric material, such as silicon oxide in the present example. The TFET isolation layer 150 may alternatively include other suitable dielectric material, such as low k dielectric material. The TFET isolation layer 150 is disposed on the semiconductor substrate 110, the TFET isolation feature 130 and the material stacks 138 and the 140. Particularly according to the present embodiment, the thickness of the TFET isolation layer 150 is chosen such that a remaining isolation thickness T2 is about ⅓ of the total vertical height of the semiconductor mesa 120. The remaining isolation height T2 is a vertical dimension measured from the top surface of the horizontal portion of the material stack 138 up to the top surface of the TFET isolation layer 150. The length of the channel is associated with the remaining isolation thickness T2 and is determined thereby.

In one embodiment, the operation 220 includes deposition of the dielectric material (silicon oxide in the present example), performing a CMP process to remove excessive dielectric material above the semiconductor mesa 120, and etching back to recess the dielectric material to reach the desired thickness range.

In the present embodiment, the TFET isolation feature 130 and the TFET isolation 150 both include silicon oxide and are collectively labeled with numeral 150 in FIG. 10.

Figure 11:
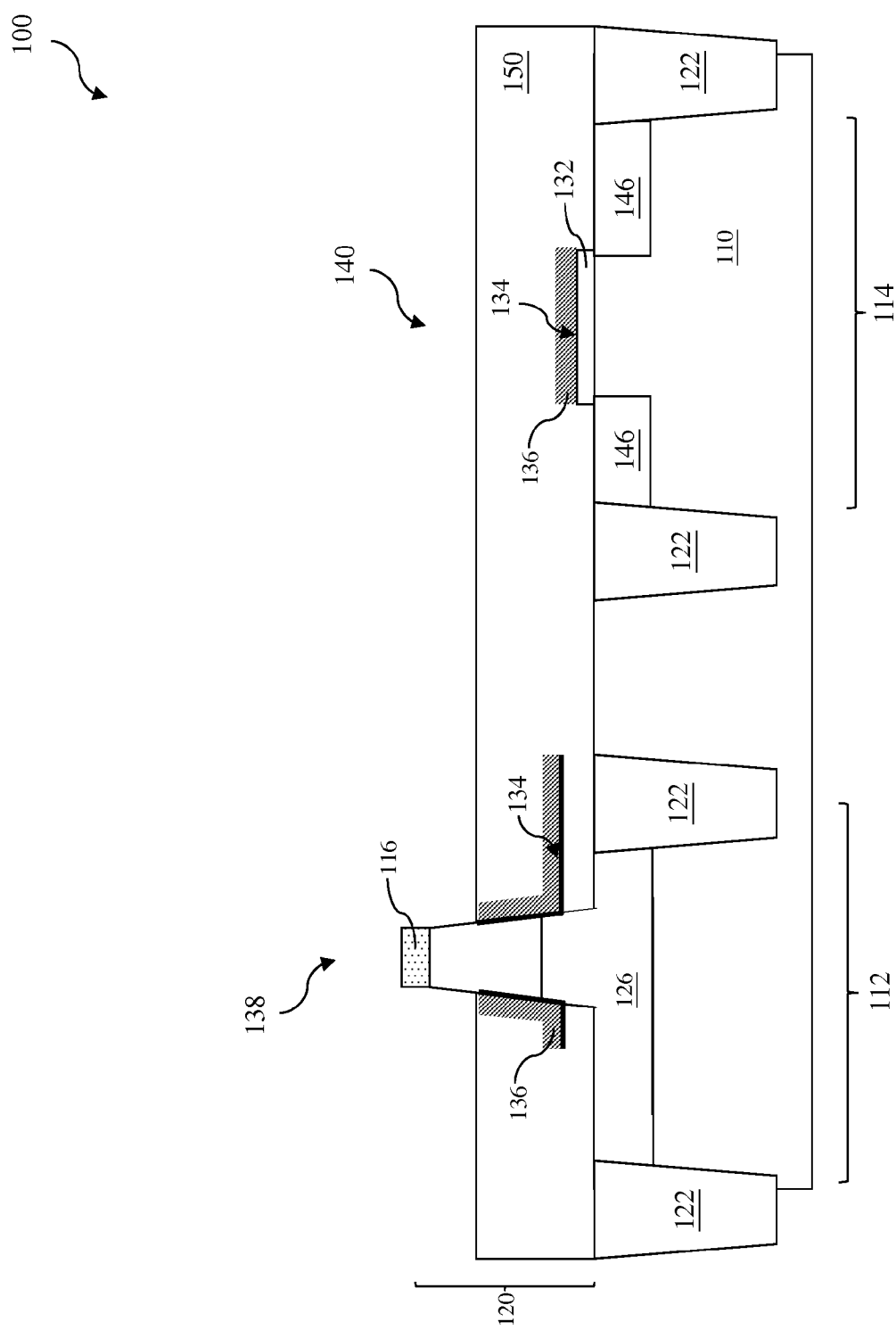

Referring to FIGS. 11 and 14, the method 200 includes an operation 222 to remove a portion of the material stack 138 uncovered by the TFET isolation layer 150. The operation 222 includes an etch process to selectively etch the gate material layers in the tip portion of the material stack 138. The etch process may include more than one steps tuned to etch respective gate material layers. By removing the tip portion of the material stack 138, the gate stack of the corresponding TFET is formed on the sidewall of the middle portion of the semiconductor mesa 120.

Figure 12:
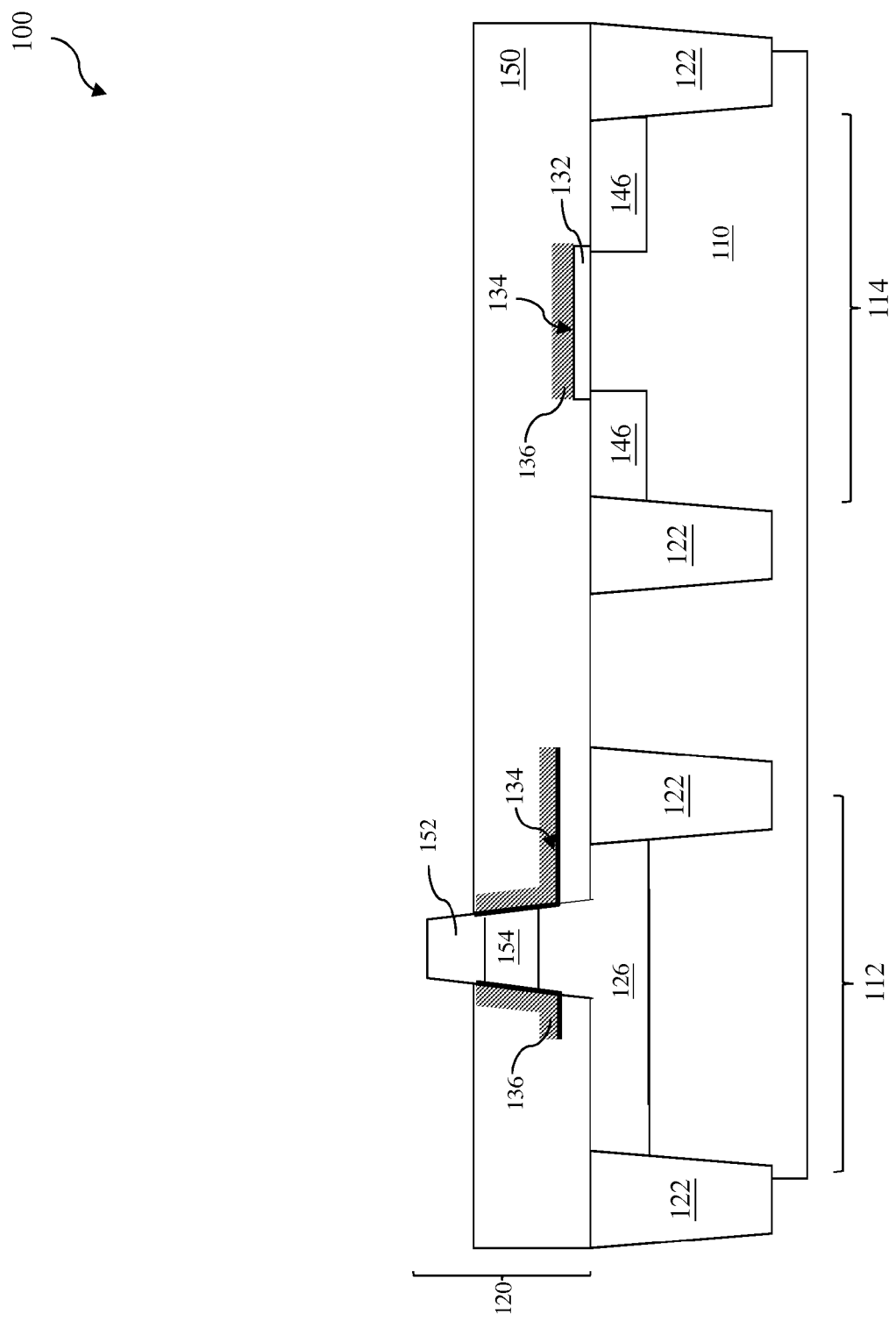

Referring to FIGS. 12 and 14, the method 200 includes an operation 224 to form a source 152 of the TFET device in the semiconductor mesa 120. In the present embodiment, the source 152 is formed in the tip portion of the semiconductor mesa 120. Particularly, the drain 126 has a first type conductivity and the source 152 has a second type conductive that is opposite from the first type conductivity. For example, if the first type conductivity is n-type (or p-type), the second type conductivity is p-type (or n-type). In one embodiment where the TFET is n-type, the drain 126 includes a n-type dopant (such as phosphorous) and the source 152 includes a p-type dopant (such as boron). In another embodiment where the TFET is p-type, the drain 126 includes a p-type dopant and the source 152 includes a n-type dopant.

In one embodiment, the operation 224 includes removing the hard mask 116 by an etch process, and performing a second ion implantation to the semiconductor mesa 120. During the ion implantation, the TFET isolation layer 150 is used as an implantation mask so that only the tip portion of the semiconductor mesa 120 is implanted thereby.

In another embodiment, the operation 224 includes removing the hard mask 116, forming a patterned photoresist layer on the TFET isolation layer 150, performing the ion implantation process using the patterned photoresist layer as an implantation mask, and removing the patterned photoresist layer thereafter. The patterned photoresist layer has an opening configured such that the semiconductor mesa 120 is uncovered by the patterned photoresist layer.

Figure 14:
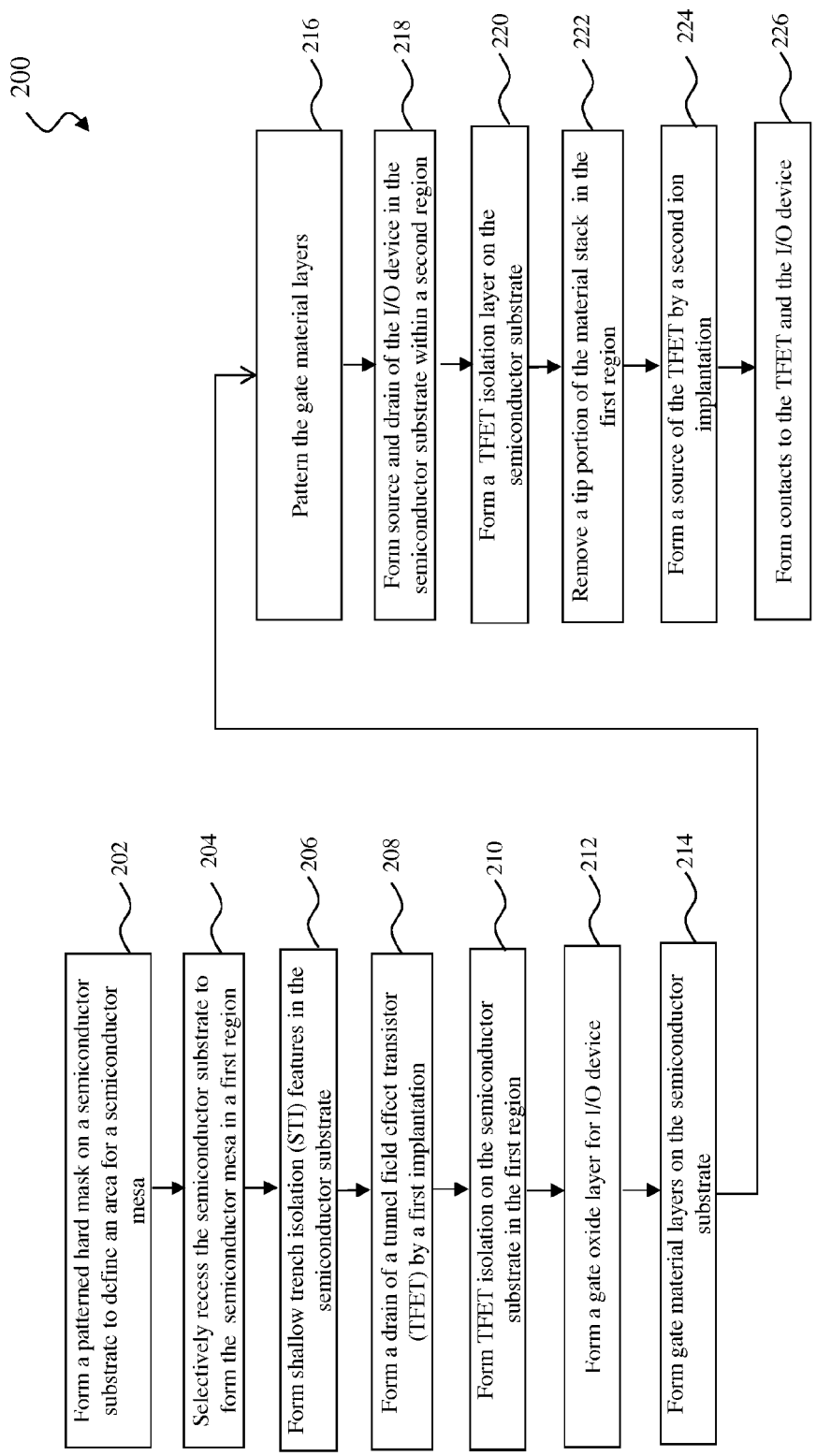
FIG. 14 is a flowchart of a method to form the semiconductor structure of FIG. 13 constructed according to one embodiment.
Figure 14A:
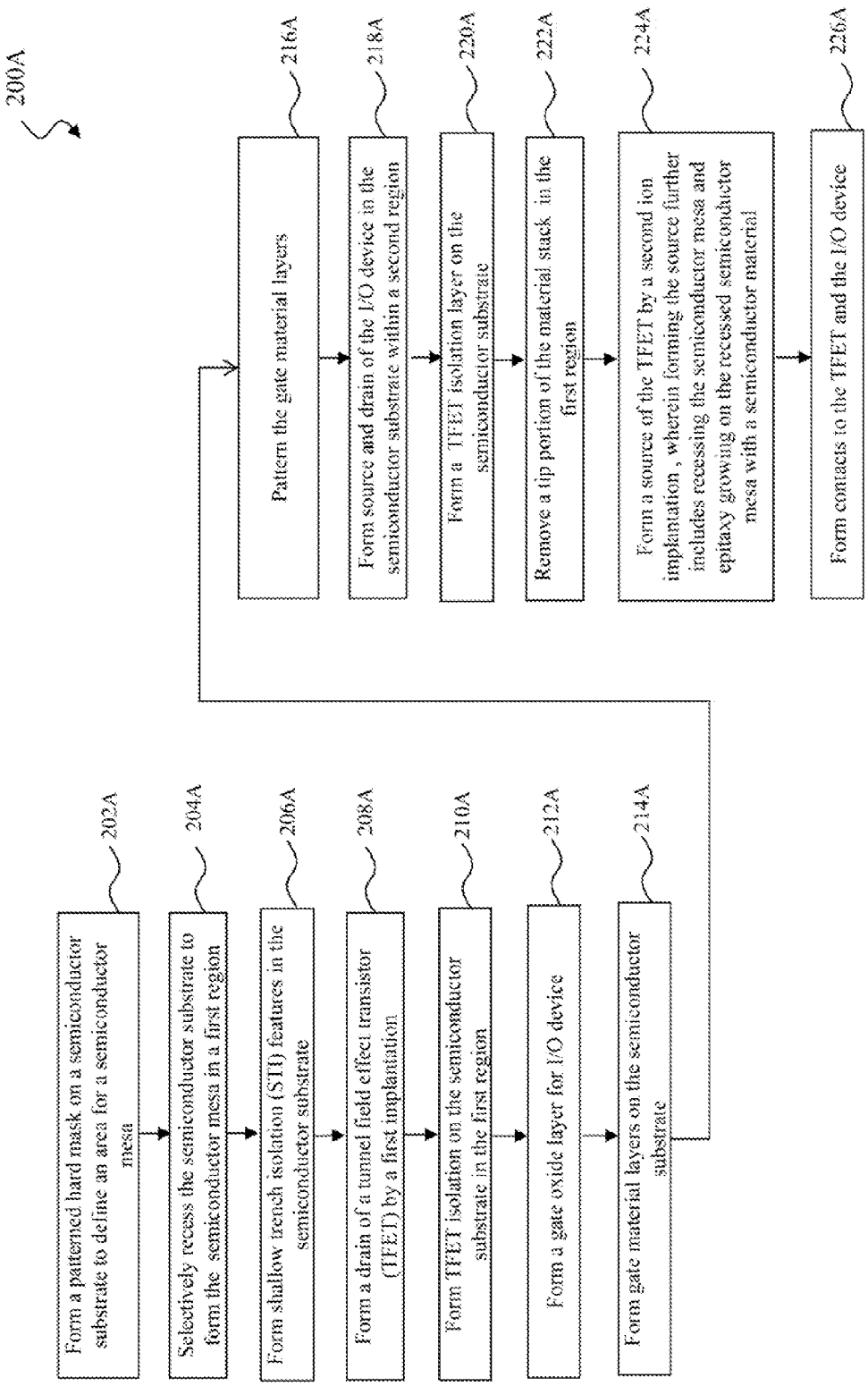
FIG. 14A is a flowchart of another method to form the semiconductor structure of FIG. 13 constructed according to another embodiment.

In yet another embodiment, shown in FIG. 14A, in which operations 202A-224A of method 200A are substantially similar to operations 202-224 of method 200 of FIG. 14, the operation 224A further includes recessing the semiconductor mesa 120 and epitaxy growing on the recessed semiconductor mesa 120 with a semiconductor material that is same to that of the semiconductor substrate 110 (such as silicon) or different (such as silicon germanium). Dopant of the source 152 may be introduced by an ion implantation in-situ doping. In the in-situ doping, the epitaxy growth includes a precursor having the corresponding dopant chemical so that the dopant is simultaneously formed during the epitaxy growth. This method may achieve a high doping concentration of the source 152. In a particular example, the operation 224A includes removing the hard mask 116, recessing a portion of the semiconductor mesa 120 by an etch process, and epitaxy growing on the recessed semiconductor mesa with in-situ doping. According to one embodiment, by recessing and epitaxy growth, thus formed source 152 has a smoother interface between the source and the channel. Furthermore, the corresponding junction has an enhanced performance.

The operation 224 may further include an annealing process to anneal the source 152 for activation. The annealing process may be implemented right after the corresponding ion implantation (or epitaxy growth) or is alternatively implemented after the formation of other doped features for collective activation. In various examples, the annealing process includes RTA, laser annealing, spike annealing, MSA, or other suitable annealing technique.

Accordingly, a channel 154 is defined between the source 152 and the drain 126. The channel is defined in the middle portion of the semiconductor mesa 120. The channel 154 is vertically configured so that the current of the TFET vertically flows through the channel 154 from the source 152 to the drain 126. The drain 126, the channel 154 and the source 152 are vertically configured as well.

In one embodiment, the channel 154 is neutral (un-doped). In another embodiment, the channel is lightly doped. In one example, the channel 154 has a conductivity type same to the conductivity type of the drain 126. For instance, the channel has a n-type dopant when the TFET is n-type, or the channel has a p-type dopant when the TFET is p-type. In this case, the doping concentration of the channel 154 is substantially less than that of the drain 126.

In the present embodiment, the source 152 has a small overlap with the gate stack of the TFET to ensure that the channel 154 is completely coupled with and controlled by the gate stack.

Figure 13:
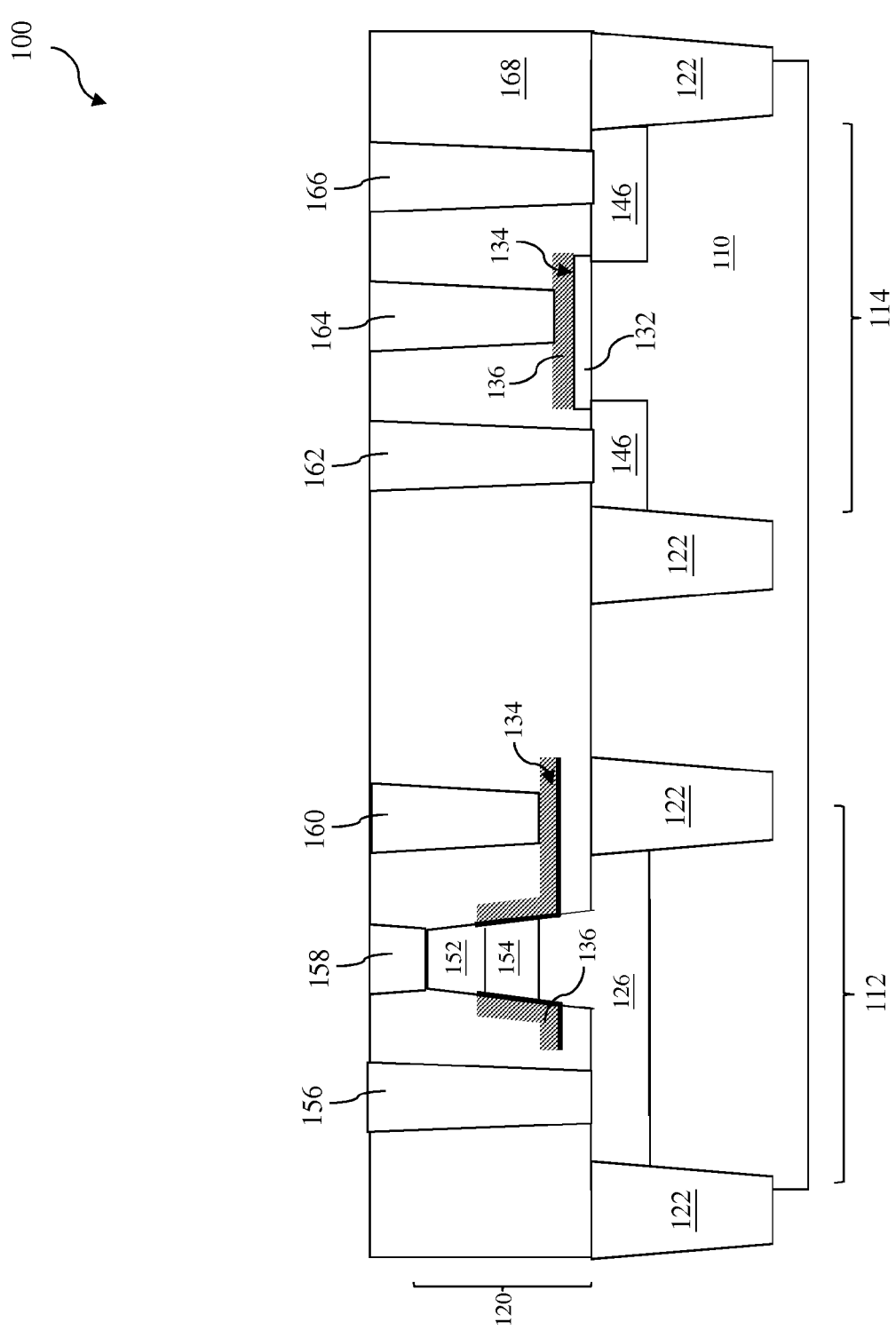

Referring to FIGS. 13 and 14, the method 200 may further include an operation 226 to form various contacts to the TFET in the first region 112 and the I/O device in the second region 114. In the present embodiment, the contacts 156, 158, 160, 162, 164 and 166 are formed in an interlayer dielectric (ILD) 168. Particularly, in the first region 112, the contact 156 is configured to land on the drain 126, the contact 158 is configured to land on the source 152, and the contact 160 is configured to land on the gate stack of the TFET. In the second region 114, the contact 162 and the contact 166 are configured to land on the source and drain features 146, respectively, and the contact 164 is configured to land on the gate stack of the I/O device.

In FIG. 13, the ILD 168 collectively refers to the dielectric material layers that include the TFET isolation feature 130 and the TFET isolation layer 150 and further include a dielectric material layer deposited on the TFET isolation layer 150. The ILD 168 includes silicon oxide or a low k dielectric material or other suitable dielectric material. In various embodiment, the ILD 168 includes silicon oxide, silicon nitride, silicon oxynitride, polyimide, spin-on glass (SOG), fluoride-doped silicate glass (FSG), carbon doped silicon oxide, low-k dielectric material, and/or other suitable materials. The ILD 168 may be formed by a technique including spin-on, CVD, sputtering, or other suitable processes.

The contacts are conductive components in the interconnect structure and provide electrical routing between the devices and the metal line in the vertical direction. In one embodiment, the operation 226 includes depositing a dielectric material layer for the ILD, performing a CMP process to planarize the ILD, forming a patterned mask layer having a plurality of openings to define the regions for the contacts, etching to form the trenches for the contacts using the patterned mask layer as an etch mask, filling a conductive material in the trenches, and performing another CMP process to remove the excessive conductive material formed on the ILD. The patterned mask layer may be a patterned hard mask layer or alternatively a patterned photoresist layer. The patterned hard mask layer is similar to the patterned hard mask 116 in terms of formation and composition. The formation of the patterned photoresist layer is similar to that of the other patterned photoresist layers previously described. The conductive material of the contacts includes metal, metal alloy or other suitable conductive material. In the present embodiment, the conductive material of the contacts includes tungsten (W). The contacts may further include other material. For example, the contacts include a lining layer, such as titanium nitride or tantalum nitride, formed on the sidewalls of the trenches before the filling of the conductive material to the trenches. The filling of the conductive material in the trenches may use a suitable technology, such as CVD or plating.

The operation 226 may further includes forming other interconnect features and other fabrication steps (such as passivation) in the backend of the line. The interconnect structure includes horizontal conductive features (metal lines) and vertical conductive features (such as vias and contacts). The interconnect structure includes conductive materials such as aluminum, aluminum/silicon/copper alloy, titanium, titanium nitride, tungsten, polysilicon, metal silicide, or combinations, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical (via and contact) and horizontal connects (conductive line). Alternatively, a copper multilayer interconnect may be used and include copper, copper alloy, titanium, titanium nitride, tantalum, tantalum nitride, tungsten, polysilicon, metal silicide, or combinations. The copper multilayer interconnect may be formed by a technique such as CVD, sputtering, plating, or other suitable process. The metal silicide used in multilayer interconnects may include nickel silicide, cobalt silicide, tungsten silicide, tantalum silicide, titanium silicide, platinum silicide, erbium silicide, palladium silicide, or combinations thereof.

Other fabrication steps may be implemented before, during and after the operations of the method 200.

Thus formed semiconductor structure 100 includes a vertical TFET and a MOSFET integrated together in a circuit. In the present embodiment, the gate stack for the vertical TFET in the first region 112 and the gate stack for the MOSFET in the second region 114 have different gate dielectric thickness, enabling the tuning the gate dielectric. Especially, the MOSFET is an I/O device and needs a thicker and robust gate dielectric for protection in electrostatic discharge or power surge, the MOSFET in the second region 114 has an additional gate oxide layer 132.

The method 200 and the semiconductor structure 100 made thereby are described above in various embodiments. However, the present disclosure may include other alternatives and modifications. For example, in one embodiment, the operation 212 to form the gate oxide layer 132 in the second region is eliminated when the MOSFET in the second region 114 does not necessarily require thicker gate dielectric.

In another embodiment, the device in the second region 114 is a capacitor. In this case, the device is a two terminal passive device. The gate electrode layer 136 in the second region function as a top electrode of the capacitor, the gate dielectric layer 134 and the gate oxide 132 function as a dielectric material of the capacitor. The gate oxide layer 132 can be used to tune the capacitance of the capacitor by tuning the thickness. In furtherance of the embodiment, the gate oxide layer 132 may alternatively use other dielectric material for further tuning the capacitance of the capacitor. The semiconductor region of the semiconductor substrate 110 directly underlying the top electrode functions as a bottom electrode of the capacitor. This semiconductor region is doped to have enough conductivity. The source and drain features 146 functions as the region for the respective contacts (162 and 166) to electrically couple to the bottom electrode. The contacts 162 and 166 are configured to be coupled to a same power line.

Figure 15:
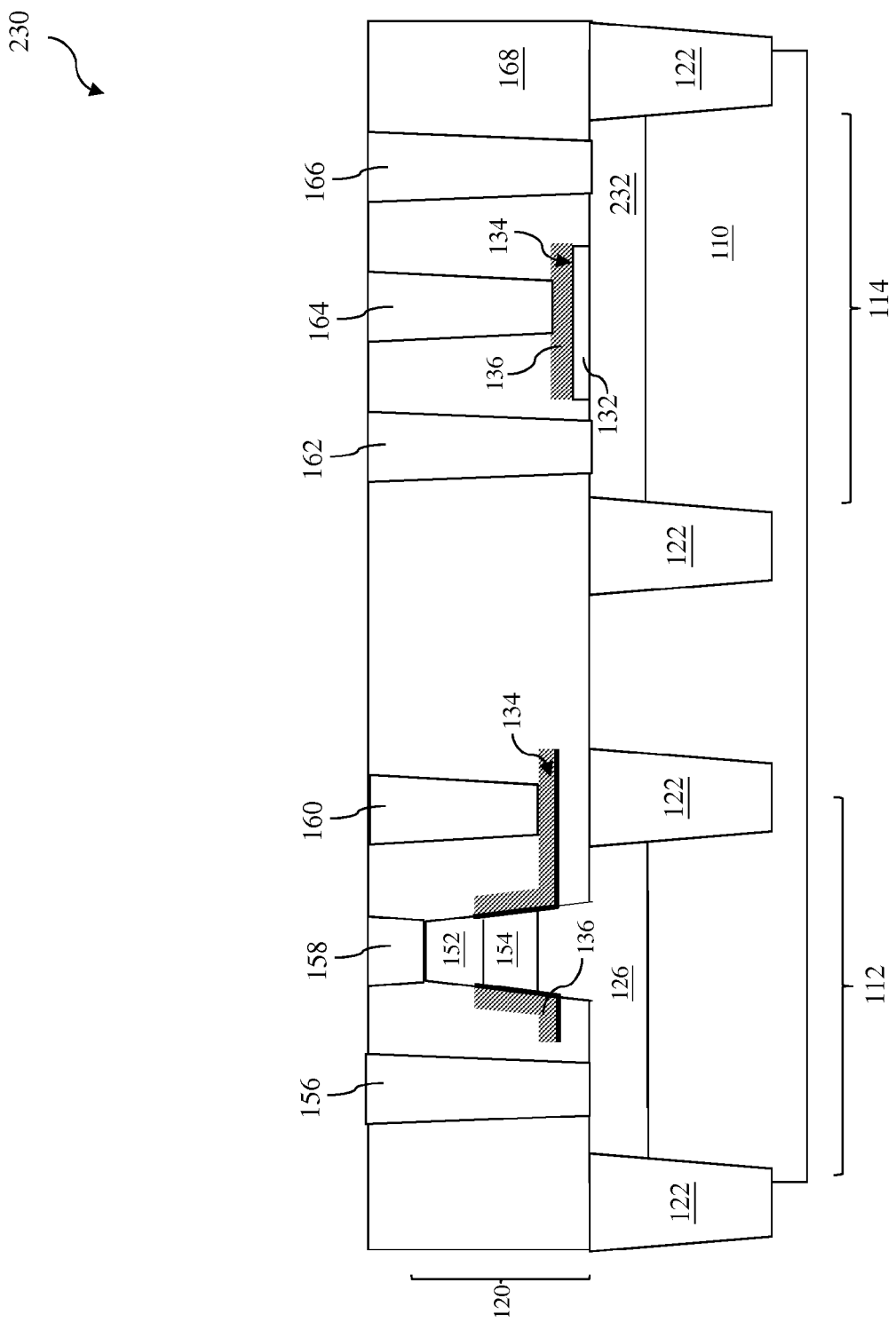
FIG. 15 is a sectional view of a semiconductor structure having a TFET structure and a capacitor constructed according to another embodiment.

FIG. 15 is a sectional view of a semiconductor structure 230 constructed according to another embodiment of the present disclosure. Similar descriptions (including features and operations to form the features) are eliminated for simplicity. The semiconductor structure 230 includes a vertical TFET in the first region 112 and a capacitor in the second region 114. In this embodiment, the bottom electrode of the capacitor is a doped region 232 underlying the top electrode and the capacitor dielectric and further extending beyond both sides for the corresponding contacts to land on. The doped region 232 is formed by the operation 208 or the operation 218 but is implemented before the formation of the gate material layers. For example, the operation 218 may be implemented after the operation 210 and before the operation 212.

Figure 16:
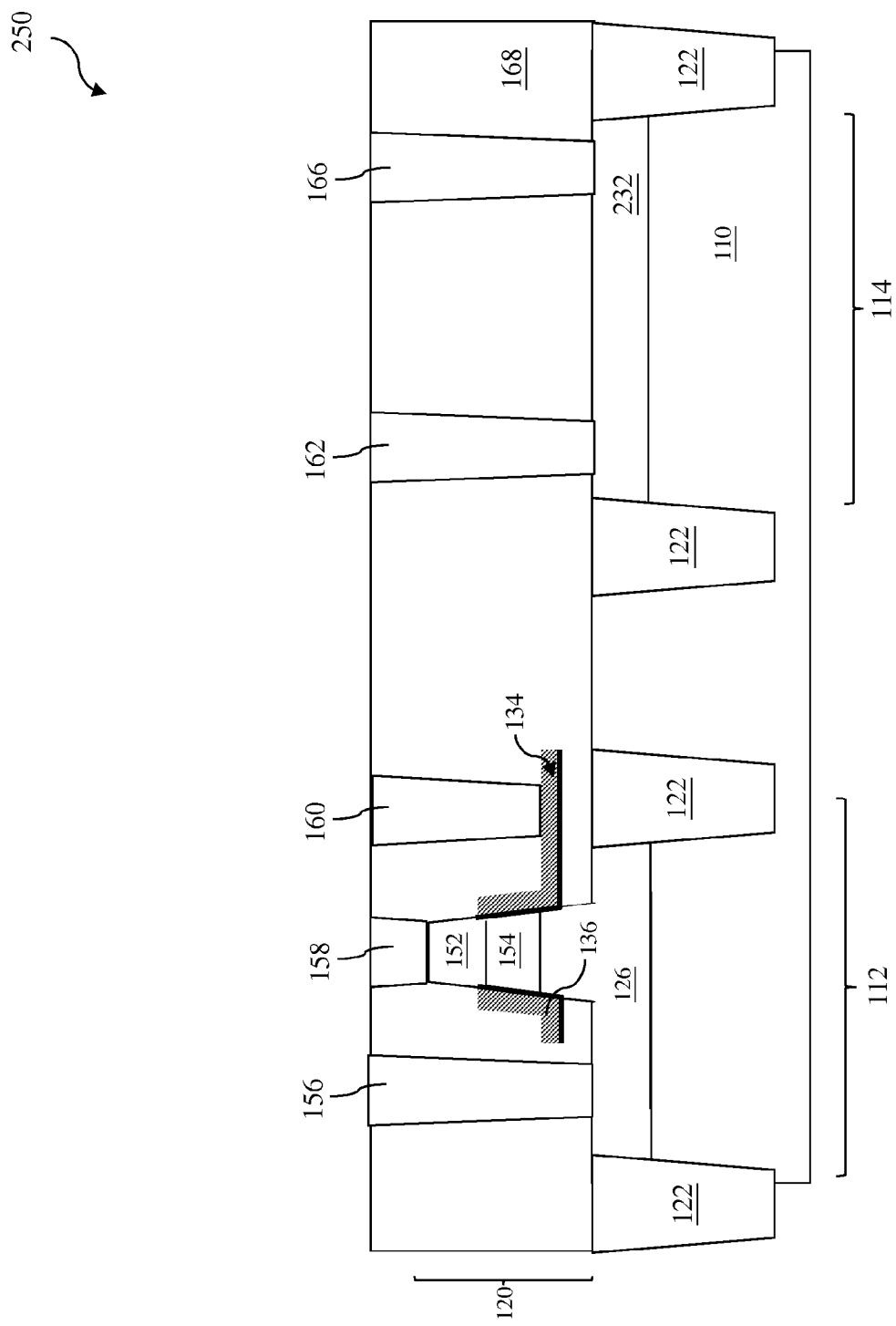
FIG. 16 is a sectional view of a semiconductor structure having a TFET structure and a resistor constructed according to another embodiment.

FIG. 16 is a sectional view of a semiconductor structure 250 constructed according to another embodiment of the present disclosure. The semiconductor structure 250 includes a vertical TFET in the first region 112 and a resistor in the second region 114. In this embodiment, the gate stack in the second region 114 is eliminated. The operation 216 to pattern the gate material layers is designed to pattern the gate material layers to form a gate stack in the first region but not in the second region. For example, the photomask used to pattern the gate material layers is defined differently such that the gate material layers in the second region 114 are removed by the etch process. The doped region 232 is formed in the semiconductor substrate 110 in the second region. The operation 208 or the operation 218 to form the doped region 232 may be implemented in the sequence as same as the method 200. Alternatively, the operation 218 is implemented before the formation of the gate material layers. For example, the operation 218 may be implemented after the operation 210 and before the operation 212.

The doped region 232 functions as a resistor. The resistance of the resistor can be tuned by the dopant concentration. The contacts are configured differently since the resistor is a two terminal passive device. In one embodiment, two contacts 162 and 166 are formed on two sides of the doped region 232. In other embodiment, more contacts are formed on two sides of the doped region 232. For example, multiple contacts are formed on the left side of the doped region 232 and are configured in a line, serving as a first terminal of the resistor. Multiple contacts are formed on the right side of the doped region 232 and are configured in a line, serving as a second terminal of the resistor.

Thus, the present disclosure provides one embodiment of a method of forming a tunnel field effect transistor (TFET). The method includes forming a semiconductor mesa on a semiconductor substrate; performing a first implantation to the semiconductor substrate and the semiconductor mesa to form a drain of a first type conductivity; forming a first dielectric layer on the semiconductor substrate and sidewall of the semiconductor mesa; forming a gate stack on the sidewall of the semiconductor mesa and the first dielectric layer; forming a second dielectric layer on the first dielectric layer and the gate stack; and forming, on the semiconductor mesa, a source having a second type conductivity opposite to the first type conductivity. The gate stack includes a gate dielectric and a gate electrode on the gate dielectric. The source, drain and gate stack are configured to form the TFET.

The present disclosure provides another embodiment of a method of forming a semiconductor structure having a tunnel field effect transistor (TFET). The method includes providing a semiconductor substrate having a first region and a second region; forming a semiconductor mesa on the semiconductor substrate within the first region; performing a first implantation to the semiconductor substrate within the first region and the semiconductor mesa to form a drain of the TFET, wherein the drain of the TFET has a first type conductivity; forming a first dielectric layer on the semiconductor substrate within the first region and sidewalls of the semiconductor mesa; forming a second dielectric layer and a conductive layer on the first dielectric layer; patterning the second dielectric layer and the conductive layer to form a first gate stack in the first region; performing a second implantation to the semiconductor substrate within the second region; forming a third dielectric layer on the second dielectric layer; and performing a third implantation to the semiconductor mesa to form a source of the TFET, wherein the source of the TFET has a second type conductivity opposite to the first type conductivity.

The present disclosure also provides an embodiment of a semiconductor structure. The semiconductor structure includes a semiconductor substrate having a first region and a second region; a semiconductor mesa disposed on the semiconductor substrate within the first region; a tunnel field effect transistor (TFET) formed on the semiconductor substrate within the first region; and a semiconductor device formed on the semiconductor substrate within the second region. The TFET includes a first drain of a second conductivity type formed in a bottom portion of the semiconductor mesa and extended into the semiconductor substrate; a first source of a first conductivity type formed in a top portion of the semiconductor mesa; a first channel in a middle portion of the semiconductor mesa and interposed between the source and drain; and a first gate formed on sidewall of the semiconductor mesa and contacting the channel. The first gate includes a dielectric material and a conductive material on the dielectric material. The semiconductor device includes a material stack formed on the semiconductor substrate, wherein the material stack includes the dielectric material on the semiconductor substrate and the conductive material on the dielectric material and the material stack is below the first gate; and two doped features of a same conductive type, formed in the semiconductor substrate and on sides of the material stack. The second conductivity type is opposite to the first conductivity type.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming a transistor, the method comprising:
    forming a mesa on a semiconductor substrate, the mesa having a first type conductivity;
    forming a first dielectric layer on a sidewall of the mesa;
    forming a gate stack on the sidewall of the mesa and the first dielectric layer, wherein the gate stack includes a gate electrode;
    after forming the gate stack, forming a protection layer over the mesa;
    performing an implantation process to substrate while the mesa is protected by the protection layer;
    forming a second dielectric layer on the gate stack; and
    forming, on the mesa, a region having a second type conductivity opposite to the first type conductivity, wherein the forming, on the mesa, the region having a second type conductivity opposite to the first type conductivity includes recessing the mesa and epitaxy and growing a semiconductor material on the mesa.

2. The method of claim 1, wherein the forming a first dielectric layer includes forming the first dielectric with a first thickness such that a first top surface of the first dielectric layer is lower than a second top surface of the mesa.

3. The method of claim 1, further comprising performing an implantation process to the mesa to form another region of the first type conductivity in the mesa.

4. A method of forming a semiconductor structure having a tunnel field effect transistor (TFET), the method comprising:
    providing a semiconductor substrate having a first region and a second region;
    forming a semiconductor mesa on the semiconductor substrate within the first region;
    performing a first implantation to the semiconductor substrate within the first region and the semiconductor mesa to form a drain of the TFET, wherein the drain of the TFET has a first type conductivity;
    forming a first dielectric layer on the semiconductor substrate within the first region and sidewalls of the semiconductor mesa;
    forming a second dielectric layer and a conductive layer on the first dielectric layer;
    patterning the second dielectric layer and the conductive layer to form a first gate stack in the first region;
    after performing the first implantation and while masking the first region of the semiconductor substrate, performing a second implantation to the semiconductor substrate within the second region;
forming a third dielectric layer on the second dielectric layer; and
performing a third implantation to the semiconductor mesa to form a source of the TFET, wherein the source of the TFET has a second type conductivity opposite to the first type conductivity.

5. The method of claim 4, wherein
the first dielectric layer has a top surface lower than a top surface of the drain of the TFET; and
the third dielectric layer has a top surface higher than a top surface of the drain of the TFET.

6. The method of claim 4, further comprising performing an etch process to remove the top portion of the first stack above a surface of the third dielectric layer after the forming a third dielectric layer and before the performing a third implantation, resulting in a gate of the TFET.

7. The method of claim 4, further comprising forming an interfacial layer on the semiconductor substrate within the second region, wherein
the forming a second dielectric layer and a conductive layer includes forming the second dielectric layer and the conductive layer on the interfacial layer,
the patterning the second dielectric layer and the conductive layer includes patterning the second dielectric layer and the conductive layer to form a second gate stack,
the performing a second implantation includes performing the second implantation to form a second source and a second drain of a same conductivity type in the semiconductor substrate within the second region after the patterning the second dielectric layer and the conductive layer, the second source and drain being interposed by the second gate stack, and
the second gate stack, the second source and the second drain are configured to form a field effect transistor.

8. The method of claim 4, wherein
the performing a second implantation includes performing the second implantation to form a doped feature as a bottom electrode in the semiconductor substrate within the second region,
the forming a second dielectric layer and a conductive layer includes forming the second dielectric layer and the conductive layer on the semiconductor substrate within the second region,
the patterning the second dielectric layer and the conductive layer includes patterning the second dielectric layer and the conductive layer to form a patterned dielectric layer and a top electrode on the bottom electrode, and
the top electrode, the patterned dielectric layer and the bottom electrode are configured to form a capacitor.

9. The method of claim 4, wherein the performing a second implantation includes performing the second implantation to form a resistor in the semiconductor substrate within the second region.

10. The method of claim 4, wherein the masking the first region of the semiconductor substrate includes forming a photoresist layer over the first gate stack.

11. The method of claim 4, wherein the second implantation forms a source and a drain of a planar transistor in the second region.

12. The method of claim 4, further comprising:
forming a second gate stack including the second dielectric layer and the conductive layer, wherein the second gate stack for one of a n-type an p-type metal oxide semiconductor field effect transistor (MOSFET).

13. A method of forming a tunnel field effect transistor (TFET), the method comprising:
forming a semiconductor mesa on a semiconductor substrate;
performing a first implantation to the semiconductor substrate and the semiconductor mesa to form a drain of a first type conductivity;
forming a first dielectric layer on the semiconductor substrate and sidewall of the semiconductor mesa;
forming a gate stack on the sidewall of the semiconductor mesa and the first dielectric layer, wherein the gate stack includes a gate dielectric and a gate electrode on the gate dielectric;
forming a protection layer over the semiconductor mesa;
performing an implantation process to semiconductor substrate while the mesa is protected by the protection layer;
forming a second dielectric layer on the first dielectric layer and the gate stack; and
forming, on the semiconductor mesa, a source having a second type conductivity opposite to the first type conductivity, wherein the source, drain and gate stack are configured to form the TFET, wherein the forming, on the semiconductor mesa, the source includes:
recessing the semiconductor mesa; and
epitaxy growing a semiconductor material on the semiconductor mesa.

14. The method of claim 13, wherein the forming a first dielectric layer on the semiconductor substrate and sidewall of the semiconductor mesa includes forming the first dielectric with a first thickness such that a first top surface of the first dielectric layer is lower than a second top surface of the drain.

15. The method of claim 13, wherein the forming a second dielectric layer on the first dielectric layer and the gate stack includes forming the second dielectric with a second thickness such that a channel is defined in the semiconductor mesa and the channel has a length is determined by the second thickness.

16. The method of claim 13, further comprising forming a plurality of shallow trench isolation (STI) features in the semiconductor substrate after the forming a semiconductor mesa and before the forming a first dielectric layer, wherein the forming a plurality of STI features in the semiconductor substrate includes:
etching the semiconductor substrate to form trenches therein through openings of an etch mask;
filling in the trenches with a dielectric material;
performing a chemical mechanical polishing (CMP) process to remove excessive portions of the dielectric material above the semiconductor mesa; and
etching back the dielectric material.

17. The method of claim 13, wherein the forming a semiconductor mesa on the semiconductor substrate includes
forming a patterned hard mask layer on the semiconductor substrate to define a region for the semiconductor mesa; and
performing an etch to the semiconductor substrate using the patterned hard mask layer as an etch mask.

18. The method of claim 17, wherein the etch is tuned such that the semiconductor mesa has a sloped sidewall with an angle less than 90° and greater than 45°, wherein the angle is relative to a top surface of the semiconductor substrate.

19. The method of claim 1, wherein the forming a second dielectric layer on the first dielectric layer and the gate stack includes forming the second dielectric layer having a thickness such that a top portion of the gate stack on a top portion of the semiconductor mesa is uncovered.

20. The method of claim 19, further comprising removing the top portion of the gate stack uncovered by the second dielectric layer.

\* \* \* \* \*